United States Patent [19]

Fan et al.

[11] Patent Number: 4,514,581
[45] Date of Patent: * Apr. 30, 1985

[54] SOLAR CELLS HAVING ULTRATHIN ACTIVE LAYERS

[75] Inventors: John C. C. Fan, Chestnut Hill; Carl O. Bozler, Sudbury, both of Mass.

[73] Assignee: Massachusetts Institute of Technology, Cambridge, Mass.

[*] Notice: The portion of the term of this patent subsequent to Mar. 8, 2000 has been disclaimed.

[21] Appl. No.: 440,090

[22] Filed: Nov. 8, 1982

Related U.S. Application Data

[63] Continuation of Ser. No. 57,874, Jul. 16, 1979, Pat. No. 4,376,228.

[51] Int. Cl.³ .............................................. H01L 31/06
[52] U.S. Cl. .................................. 136/255; 136/258; 136/259; 136/261; 357/30
[58] Field of Search ............... 136/258 DC, 258 AM, 136/259, 246, 255, 261; 357/30

[56] References Cited

U.S. PATENT DOCUMENTS 4,376,228 3/1983 Fan et al. ............................ 136/255

FOREIGN PATENT DOCUMENTS 2715471 10/1978 Fed. Rep. of Germany ...... 136/259

OTHER PUBLICATIONS

V. K. Jain et al., "A New Thin Solar Cell with Totally Reflecting Back Mirror", *Phys. Stat. Sol.* (a) 30, K69–K72, (1972).

*Primary Examiner*—Aaron Weisstuch
*Attorney, Agent, or Firm*—Arthur A. Smith, Jr.; David E. Brook

[57] ABSTRACT

Improvements in solar cells based upon low cost semiconductors, such as amorphous silicon, are disclosed. The improved solar cells of this invention have ultrathin active semiconductor layers having a thickness between 0.1 $t_\alpha$ and $L_m$ wherein $t_\alpha$ is the solar spectrum absorption length and $L_m$ is the diffusion length for photogenerated minority charge carriers in the active layer. The back surface reflector has a solar spectrum reflectivity of 70% or greater, so that incident energy not absorbed in a direct pass through the active layer is reflected for another pass. The most preferred embodiment of the cells described herein are shaped to have a light-trapping structure so that light makes mulitple passes through the thin semiconductor layers.

15 Claims, 12 Drawing Figures

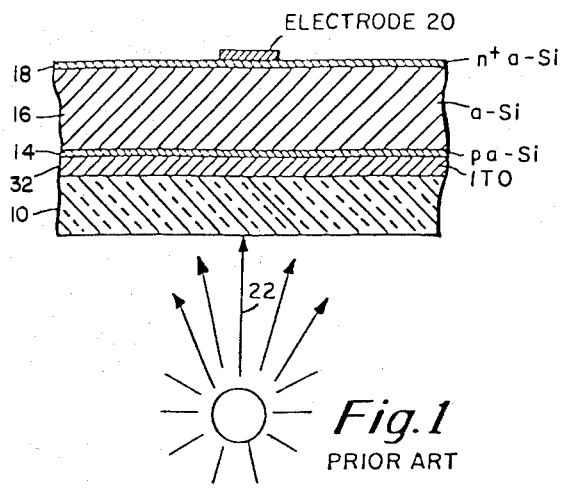
Fig. 1
PRIOR ART
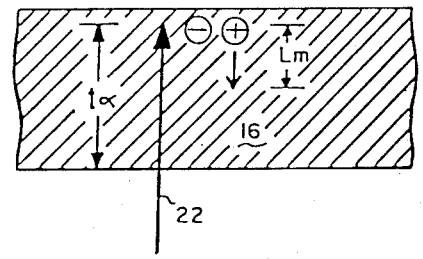
Fig. 2
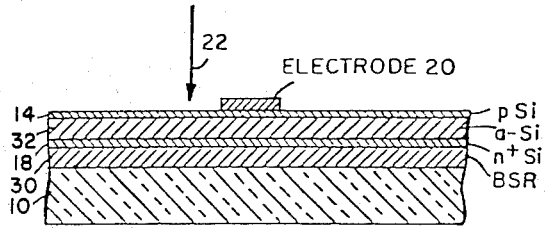
Fig. 3
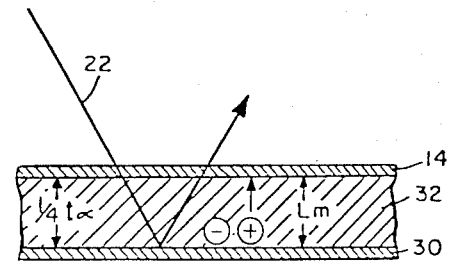
Fig. 4
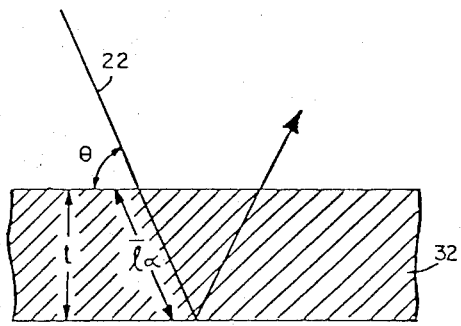
Fig. 5
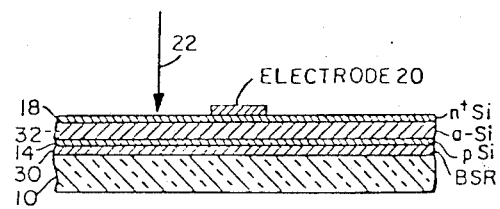
Fig. 6
Fig. 7
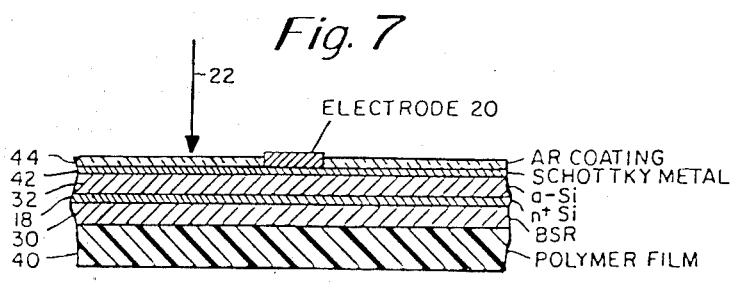

SOLAR CELLS HAVING ULTRATHIN ACTIVE LAYERS

GOVERNMENT SUPPORT

Work relating to this invention was supported by the United States Air Force.

This application is a continuation, of application Ser. No. 57,874, filed July 16, 1979, now U.S. Pat. No. 4,376,228.

TECHNICAL FIELD

This invention is in the field of photovoltaic devices, particularly solar cells for producing electrical energy from sunlight.

BACKGROUND ART

Typically, photovoltaic devices have been based upon a semiconductor layer having both an ohmic contact to a conducting sheet on one side, and a rectifying contact, such as a p-n junction or a Schottky barrier, on the other side to effect charge separation. Many semiconductor materials have been tested for use in photovoltaic devices, with the most widely used material for solar cells being silicon.

In order to achieve reasonably high power efficiencies for solar cells, however, it has heretofore been necessary to employ single crystal silicon of exceptionally high purity. Costs for producing this exceptionally high purity single crystal silicon have been inordinately high and have prevented silicon solar cells from being cost competitive with more conventional means of producing electrical power in most applications. Thus, silicon solar cells have only been used to any significant extent in applications where cost is not a controlling factor, such as on space vehicles or in power sources employed in remote areas.

More recent work has been directed towards producing efficient solar cells from amorphous silicon-based materials in order to lower the costs of such cells. One particular cell of this type has been produced from an alloy of amorphous silicon and hydrogen deposited from a glow discharge in silane. A p-i-n structure for this type of solar cell is described by Carlson and Wronski in which a few hundred angstroms of boron-doped amorphous silicon were deposited on an indium-doped tin oxide substrate followed by a layer of "intrinsic" or undoped amorphous silicon having a thickness of about 1 $\mu$m. Thereafter, several hundred angstroms of phosphorus-doped amorphous silicon were deposited and an aluminum electrode was evaporated onto the top of the p-i-n structure to form a low-resistance contact to the n layer. See Carlson, D. E. and Wronski, C. R., *Appl. Phys. Letts.*, 28 (11), 1976, pp 671–673. The maximum power efficiency obtained for this cell, however, was only about 2.4% under air mass 1 (AM 1) illumination.

Later developments of solar cells produced from amorphous silicon-based materials deposited from glow discharge resulted in a Schottky barrier structure having power efficiencies of up to about 5.5%. See Wronski, C. R., Trans. Electron Devices, ED-24(4) 1977, pp 351-57. Schottky barriers were produced by vacuum evaporation of semitransparent metal films on the amorphous silicon layers. In the study of this Schottky barrier cell, it was concluded that the diffusion length of the minority carriers ($L_m$), in this case holes, was only about a few tenths of a micrometer and that hole transport was the limiting factor in cell efficiencies. The short diffusion length for the minority carriers was a particular problem because the absorption thickness for solar radiation in amorphous silicon was found to be on the order of about 1 $\mu$m. This means that carriers generated at distances of more than a few tenths of a micrometer from the barrier had little chance of reaching the barrier where they could contribute to the photocurrent generated. Thus, the author concluded that the efficiency of such amorphous silicon solar cells could be increased by improving the diffusion length of the minority carriers. Other authors have agreed with this conclusion. See, for example Carlson, D. E., *Transactions on Electron Devices*, ED 24 (No. 4) 1977, pp 449–453.

DISCLOSURE OF THE INVENTION

This invention relates to improved solar cells fabricated from semiconductor materials which have a diffusion length for minority carriers, $L_m$, which is less than the solar spectrum absorption thickness, $t_a$. Amorphous silicon-based materials produced by glow discharge from silane are examples of such semiconductor materials since the diffusion length for minority carriers ($L_m$) of such materials is on the order of a few tenths of a micrometer whereas the solar spectrum absorption thickness ($t_a$) is believed to be about 1 $\mu$m. For purposes of convenience, such materials are often referred to herein as "amorphous silicon."

In one embodiment, the improved solar cells of this invention have an altrathin active layer and a back surface reflector (BSR) for the active semiconductor layer. As used herein, the term "active" layer means that layer in a solar cell structure that is primarily responsible for absorption of solar energy. The back surface reflector has a solar spectrum reflectivity of at least about 70%, and preferably 90% or more. Thus, most of the incident sunlight which is passed through the ultrathin active semiconductor layer without being absorbed is reflected by the back surface reflector and passes through the semiconductor layer again, wherein further absorption occurs.

The thickness of the active semiconductor layer (t) lies between about 0.1 $t_a$ and $L_m$. If the thickness is less than about 0.1 $t_a$, there is too little absorption of incident sunlight for efficient operation, whereas if the thickness is above $L_m$, too many photogenerated charge carriers are trapped before they can reach the charge-separation barrier. The actual length over which solar absorption occurs during each pass through the active layer is often greater than the actual thickness of the active layer, however, because much of the incident sunlight strikes the cell surface at an oblique angle.

In a particularly preferred embodiment, the improved solar cells described herein are produced to have a light-trapping structure. Such a light-trapping structure might be a series of V-like shapes or troughs of various simple or complex shapes. Such shapes cause incident light which has been transmitted through an ultrathin active semiconductor layer, and reflected back out of this layer, to enter the semiconductor layer at another point where additional passes are made resulting in absorption of even more light.

Improved solar cells constructed according to this invention can be produced from semiconductor materials which are much less expensive to fabricate than high purity single crystal semiconductors. Previous efforts to employ lower cost materials have typically reduced cell performance, often due to short minority carrier diffusion lengths. The cells described herein overcome such problems associated with semiconductor materials in which the solar energy spectrum absorption thickness is greater than the diffusion length for minority carriers. Thus, higher power efficiencies can be obtained with materials which are much less expensive to produce and use in the fabrication of solar cells.

BRIEF DESCRIPTION OF THE DRAWINGS

FIG. 1 is a cross-sectional elevational view of a solar cell based upon amorphous silicon according to the prior art.

FIG. 2 is an exploded partial view of a portion of the active layer of the cell of FIG. 1 illustrating the solar spectrum absorption length, $t_\alpha$, and the diffusion length of photogenerated minority charge carriers, $L_m$.

FIG. 3 is a cross-sectional elevational view of one embodiment of a solar cell based upon amorphous silicon according to this invention.

FIG. 4 is an exploded partial view of the cell of FIG. 3 illustrating solar spectrum absorption and reflection from the back surface reflector.

FIG. 5 is a larger exploded view of the active layer of the cell of FIG. 3 illustrating the effective length of solar spectrum absorption ($t_\alpha$) for light incident at an oblique angle.

FIG. 6 is a cross-sectional elevational view of another embodiment of a solar cell according to this invention and having a p-i-n structure on a glass substrate.

FIG. 7 is a cross-sectional view of another alternative embodiment of a solar cell according to this invention in which a Schottky barrier is used as a junction.

BEST MODE OF CARRYING OUT THE INVENTION

Figure 8:
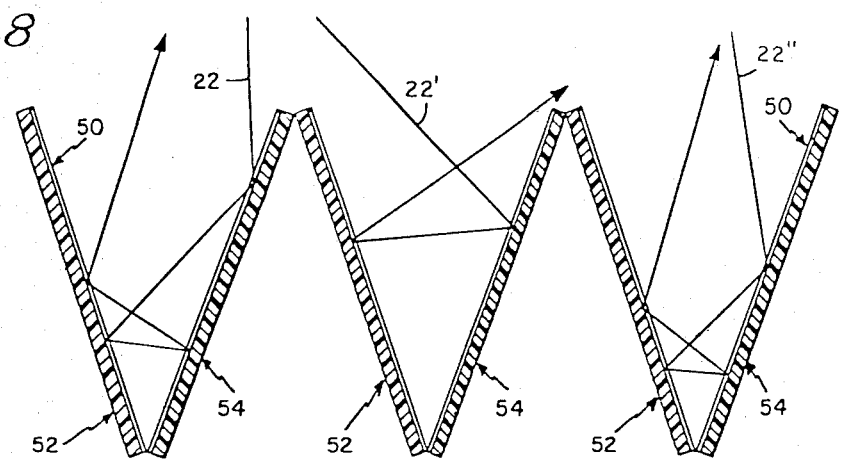
FIG. 8 is a cross-sectional elevational view of a solar cell according to this invention which has a light-trapping structure.

The invention will now be further described with particular reference to the Figures, wherein like elements have been designated by the same numerals.

FIG. 1 illustrates a typical prior art solar cell based upon amorphous silicon. This solar cell has a p-i-n structure formed upon glass substrate 10 having thereon a transparent indium-doped tin oxide coating 12. Silicon layers 14, 16 and 18 could be deposited by the glow discharge process from a silane. The p-doped layer 14 might consist of a few hundred angstroms of boron-doped silicon. Active layer 16 is deposited without intentional doping to a thickness of about 1 $\mu$m. Despite the lack of intentional doping, active layer 16 is slightly n type material. Thereafter, several hundred angstroms of phosphorus-doped amorphous silicon are deposited to form n+ doped silicon layer 18 to provide ohmic contact with electrode 20, which might be aluminum evaporated onto the p-i-n structure to form a low-resistance contact to the n+ layer. Such a cell is illustrated in FIG. 1 of Carlson, D. E. and Wronski, C. R., "Amorphous Silicon Solar Cell," *Appl. Phys. Letts.*, 28, (11), 1976 at page 672 and is described in this article. As stated in this article, the best power conversion obtained with such a cell was about 2.4% under AM 1 illumination.

FIG. 2 is an exploded partial view of layer 16 of the cell of FIG. 1, and particularly illustrates the difficulty in obtaining high power conversion efficiencies for such a cell. Incident solar energy 22 is shown entering the solar cell and is mostly absorbed in intrinsic silicon layer 16. Absorption of energy 22 occurs over substantially the entire thickness of about 1 $\mu$m since the solar spectrum absorption thickness, $t_\alpha$, for amorphous silicon is about 1 $\mu$m. Absorbed energy 22 generates charge carriers, namely electrons and holes. The minority carriers in silicon layer 16 are the holes, and as shown, the photogenerated hole migrates or diffuses for an average distance equal to the diffusion length for minority carriers ($L_m$). As shown, $L_m$ is much shorter than the distance to the p-n junction existing between p-doped silicon layer 14 and intrinsic silicon layer 16. If $L_m$ is about 0.25 micrometers for intrinsic silicon, as believed, it can be seen that about three quarters of the photogenerated charge carriers will never reach the p-n junction. Instead, they will be trapped in the silicon layer 16 until they recombine prior to reaching the barrier needed to maintain charge separation of photogenerated charge carriers. Thus, the photocurrent is significantly reduced, which is primarily responsible for the low conversion efficiency of such cells.

FIG. 3 illustrates a solar cell based upon amorphous silicon according to this invention. This cell has a back surface reflector (BSR) 30 deposited upon the glass substrate 10. Back surface reflector 30 might be a thin layer of silver, for example. Intrinsic silicon layer 32 is similar to layer 16 described above in regard to FIG. 1 except that its thickness is much less. Layer 32 has a thickness which is between 0.1 $t_\alpha$, (1/10th of the solar spectrum absorption thickness) and about $L_m$, the diffusion length of minority carriers. In the case of silicon produced by glow discharge from a silane, the diffusion length for minority carriers (holes) is about 0.25 $\mu$m, whereas the solar spectrum absorption length $t_\alpha$ is about 1 $\mu$m. Thus, silicon layer 32 has a thickness in the cell of FIG. 3 within the range of from about 0.1 $\mu$m to about 0.25 $\mu$m. These values will change, of course, for other semiconductor materials or even amorphous silicon produced by other techniques. Silicon layer 14 and electrode 20 are similar to the same elements previously described in regard to FIG. 1.

The advantage of the amorphous silicon solar cell of FIG. 3 is illustrated in FIG. 4. For purposes of this illustration, it is assumed that the thickness of layer 32 has been chosen to be 0.25 $\mu$m, which is ¼ of the solar spectrum absorption thickness ($t_\alpha$) as described above. Because layer 32 is ultrathin, a significant portion of light 22 passes through layer 32 without being absorbed. This portion of light 22 is reflected from back surface reflector 30 and passes through layer 32 wherein further absorption can occur. As in the solar cell of FIG. 1, absorbed light generates charge carriers, which in this case are a maximum of 0.25 micrometers from the p-n junction between layers 14 and 32. Since $L_m$ is about 0.25 micrometers, photogenerated holes have a high probability of migrating to the p-n junction prior to recombining, so that good charge separation is accomplished.

Although amorphous silicon layer 32 in the solar cell of FIG. 3 is only 0.25 $\mu$m thick, whereas silicon layer 16 in the cell of FIG. 1 was about 1 $\mu$m, it is not expected that the decrease in thickness of the active silicon layer will significantly lower cell efficiency, if it lowers it at all. This is because, as previously described with regard to FIG. 1, although absorption of solar energy occurred over the entire thickness of layer 16, only those photogenerated holes created to a depth of about 0.25 μm had a high probability of migrating to the p-n junction before recombination occurred. Thus, absorption of solar energy beyond this depth should have little or no value in contributing to cell efficiency. Although decreasing the thickness of an active layer of a solar cell such as the one illustrated in FIG. 1 would normally result in a decrease in cell efficiency, this is not believed to be the case in regard to the cell of FIG. 4.

In addition, since the cell of FIG. 4 has a back surface reflector 30 which reflects incident light 22 not absorbed in the first pass, the reflected light is also available to be absorbed on the reflected pass through layer 32. Thus, the length in which solar absorption can occur ($l_a$) is double the thickness of active layer 32, even for light incident at the normal to the surface of the cell in FIG. 4. Because of this doubling of the length for absorption, coupled with maintenance of the thickness of layer 32 to a thickness within the diffusion length for minority carriers, the cell efficiency should increase considerably. Thus, a unique situation is created in which the photocurrent is improved by the fact that thin active layers are employed.

Further, much of the incident sunlight on the solar cell does not strike the surface of the solar cell at the normal. Light strikes the surface at oblique angles, which means that the effective length for solar spectrum absorption is even greater than two times the thickness (t) for the active layer. The relationship between these is $$\bar{l}_a = \frac{t}{\sin\theta},$$

where $\theta$ equals the angle of incidence for sunlight striking the surface of a solar cell. This increase in effective solar spectrum adsorption length ($\bar{l}_a$) is equal to 3t. Despite the significantly increased effective length for absorption, the thickness of layer 32 is still maintained at a value equal to or less than the diffusion length for minority carriers ($L_m$). In such a cell, the probability is very high that a large percentage of the photogenerated charge carriers will migrate to the junction which maintains charge separation.

FIG. 6 illustrates another embodiment of a solar cell of this invention. In this embodiment, a p-i-n structure is deposited upon a glass substrate 10 having a back surface reflector 30. The p-i-n structure is provided by depositing a few hundred angstroms of p-doped amorphous silicon to form layer 14, followed by deposition of intrinsic silicon layer 32 and finally a few hundred angstroms of n-doped amorphous silicon layer 18. The crucial feature of the p-i-n structure illustrated in FIG. 6 is that intrinsic amorphous silicon layer 32 has a thickness between 0.1 $t_a$ and $L_m$. In this respect, the thickness of this layer is similar to those discussed above in regard to the solar cell of FIG. 3.

FIG. 7 illustrates yet another embodiment of a solar cell having an ultrathin layer of amorphous silicon according to this invention. In this embodiment, a polymeric film 40 serves as a substrate. The polymeric film can be transparent and conducting, but need be neither since it is on the back of the cell. An example of a suitable polymeric film is the poly(ethylene terephthlate) film marketed under the trademark "Mylar" by E. I. DuPont deNemours and Company. Polymeric film 40 is coated with a back surface reflector 30. The barrier in this cell is a Schottky barrier formed by depositing metal layer 42 of a material capable of forming Schottky barrier, such as silver, gold or platinum. Metal layer 42 is also kept very thin (e.g., 100Å) so that it is transparent to incident sunlight. To further increase solar energy absorption, antireflection coating 44 is and may consist of a thin transparent coating of a refractory oxide, such as titanium dioxide. Of course, any of the other type junctions could be employed with cells deposited on polymeric films.

FIG. 8 illustrates one embodiment of a light-trapping structure for solar cells according to this invention. It should be understood that any of the light-trapping structures described can be formed with any of the different barrier structure solar cells described herein or known to those skilled in the art. The light-trapping structures may also lessen the need for antireflection coatings.

As shown in FIG. 8, a solar cell 50 is contained on the inner surfaces of V-shaped supports formed from left legs 52 and right legs 54. Solar cell 50 can be any cell having an ultrathin active layer and back surface reflector as described herein. Legs 52 and 54 are illustrated as being formed from polymeric materials, but might also be formed from metals, ceramics or other materials. As shown, legs 52 and 54 are separate legs which are joined together at the tip of the V-shape. This allows easy fabrication of flat panels 52 and 54 which are later joined to form the light-trapping structure. Nevertheless, the entire V-shaped structure could be integral. Further, such light-trapping structures could be covered or encased in plastic or other materials to provide better optical coupling and/or resistance to environmental effects.

Three joined V-shaped elements are illustrated. Light rays 22, 22' and 22" are shown entering these three elements at different angles to illustrate how the V-shapes cause each of these incident rays to be reflected so that the incident light coming from different directions strikes the surface of the solar cell 50 multiple times thereby causing multiple passes through the active layer of cell 50. As those skilled in the art will recognize, a minor amount of incident light will also be reflected from the front surface of cell 50, and this minor portion of reflected light will also be directed to strike the solar cell in another location so that it can also be absorbed. As can be seen from FIG. 8, light rays coming from different angles are each caused to multiply strike the surface of solar cell 50 so that each incident ray passes through the solar cell 50 at least four times, namely two direct passes and two reflected passes. In some of the cells, as many as four reflections are illustrated which would result in eight passages through the active layer of solar cell 50. Of course, light-trapping structures can be designed to cause even more reflections of incident light. In general, a structure is light-trapping, as that term is used herein, if the structure causes a significant portion of light reflected from the first point of contact with the solar cell to enter a second area of the solar cell.

In general, it is believed that the light-trapping capability of a structure such as that illustrated in FIG. 8 will increase as the angle between the two legs of the V is decreased to some optimum value. For this or any other light-trapping shape described herein, it should be recognized that optimum conditions can be determined in order to maximize absorption of incident solar energy. Although incident solar energy passes through solar cell 50 repeatedly with such a light-trapping structure, it should once again be noted that the thickness of the active layer has not been increased beyond that of the diffusion layer for minority carriers. Thus, such minority carriers generated by the absorption of solar energy which has been reflected repeatedly to solar cell 50 can migrate to a barrier which maintains charge separation.

Figure 9:
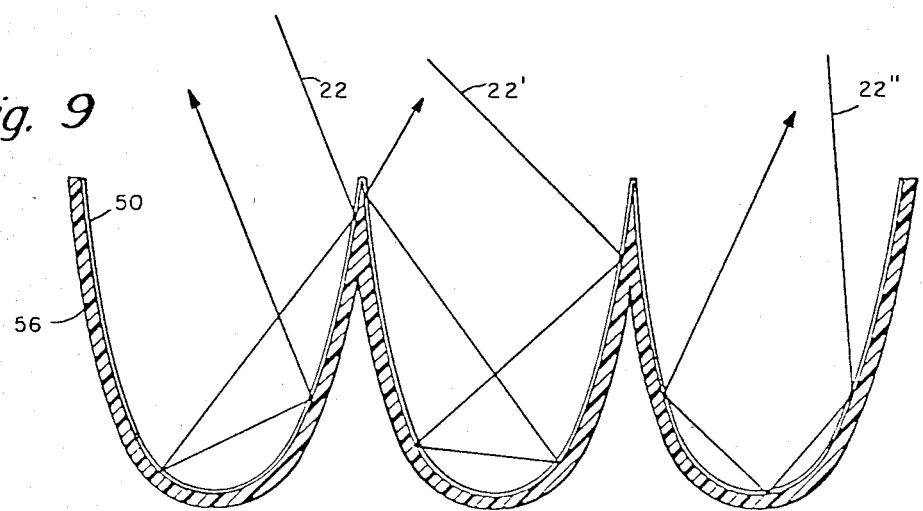
FIGS. 9-12 are cross-sectional elevational views of alternative constructions for light-trapping structures according to this invention.

An alternative light-trapping structure is illustrated in FIG. 9. In this configuration, the elements have an approximate parabola-shape formed on a polymeric film substrate 56. Three incident light rays, 22, 22' and 22" are once again shown to illustrate how each would be multiply reflected within the light-trapping structure. Thus, the structure of FIG. 9 also serves to provide for increased absorption of solar energy without increasing the thickness of the active layer of solar cell 50.

Figure 10:
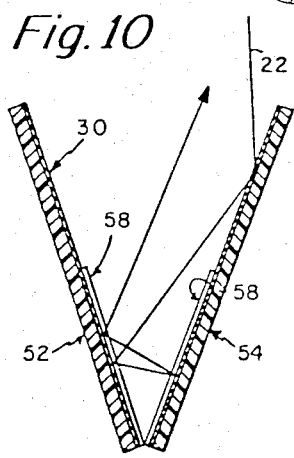

FIG. 10 illustrates yet another embodiment of solar cells according to this invention. In the embodiment of FIG. 10, a V-shaped element formed from legs 52 and 54 is illustrated which is similar to one of the V-shaped elements illustrated in the light-trapping structure of FIG. 8. Legs 52 and 54 are coated with a back surface reflector 30 over their entire length so that they reflect incident light deeper and deeper with the V-shape. Since incident light 22 is concentrated near the bottom of the V-shape, solar cells 58 are deposited only over a portion of the inner surface of the bottom of each of legs 52 and 54. Solar cells 58 may comprise any of the solar cells encompassed within this invention which have an ultrathin active layer and a back surface reflector. A cell having the structure illustrated in FIG. 10 allows efficient solar cells to be constructed which employ lesser amount of the semiconductor materials than cells are previously described herein.

Figure 11:
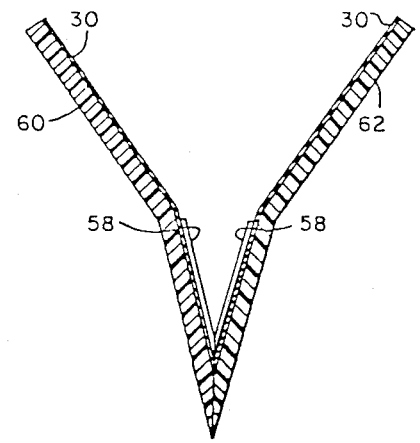

FIG. 11 illustrates a light-trapping structure also having a generally V-shape but having complex legs 60 and 62 having an upper portion of a lesser slope than the lower portion of these legs.

Figure 12:
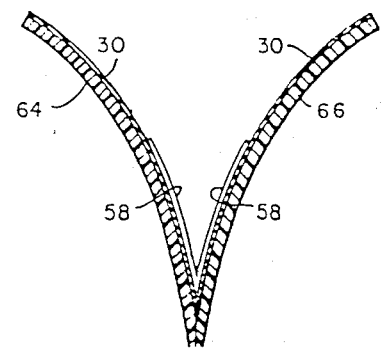

FIG. 12 illustrates a further generally V-shaped light-trapping structure in which the legs 64 and 66 of the structure have a curve.

Those skilled in the art will recognize that there is a very wide range of shapes which can provide a light-trapping structure for the solar cells according to this invention. In certain cases, a light-trapping structure can even be created by employing internal reflection, such as can be obtained in certain prisms.

Although the specific embodiments described above have been limited to silicon such as that deposited from glow discharge from a silane, those skilled in the art will recognize that other forms of silicon or other semiconductor materials can also be used. In general, the invention described herein is useful with any semiconductor material in which the minority carrier diffusion length in the active semiconductor material, $L_m$, is less than the solar energy spectrum absorption thickness, $t_\alpha$. Other such semiconductor materials include amorphous GaAs, InP, CdTe or amorphous materials based on these. Additionally, forms of semiconductors other than amorphous, such as polycrystalline or even poor varieties of single crystal materials which contain crystal faults, might be useful with this invention when $L_m < t_\alpha$.

Similarly, the back surface reflector was described above as being silver in certain embodiments. However, any reflecting material having a solar spectrum reflectivity of 70% or more could be used. Aluminum is an example of another suitable material for the back surface reflector. Metals having solar spectrum reflectivities of 90% or more, such as continuous layers of silver, are preferred. It should also be recognized, of course, that the back surface reflector could also be a thin reflecting coating of silver or other material upon a normally transparent or non-transparent substrate, such as glass or polymeric film. Alternatively, the solar cell could be deposited on a metal film which served as a back surface reflector. Further, the back surface reflector does not need to be in contact with the active layer—there can be intermediate layers.

In addition, junctions other than the p-n, p-i-n, and Schottky barriers described in regard to the specific embodiments above may also be used with the ultrathin semiconductor layers described herein.

INDUSTRIAL APPLICABILITY

This invention has industrial applicability in the fabrication of solar cells particularly solar cells based upon amorphous materials such as amorphous silicon.

EQUIVALENTS

Those skilled in the art will recognize, or be able to ascertain using no more than routine experimentation, many equivalents to the specific embodiments in the invention described herein. Such equivalents are intended to be encompassed by the following claims.

We claim:

1. In a solar cell having an active semiconductor layer which has a minority carrier diffusion length, $L_m$, which is less than the solar spectrum absorption thickness, $t_\alpha$:

The improvement of limiting said active layer to a thickness of less than $L_m$ and greater than about 0.1 $t_\alpha$ and providing said active layer with a back surface reflector.

2. The improvement of claim 1 wherein said active semiconductor layer comprises silicon.

3. The improvement of claim 2 wherein said silicon semiconductor layer is produced by deposition from a glow discharge in silane.

4. The improvement of claims 1, 2 or 3 wherein said back surface reflector comprises a layer of silver.

5. A solar cell comprising:
   a. an active layer of a semiconductor having an inherent minority carrier diffusion length, $L_m$, which is less than its solar spectrum absorption thickness $t_\alpha$, said semiconductor layer having a thickness of less than $L_m$ and greater than about 0.1 $t_\alpha$;
   b. a junction for maintaining separation of photogenerated charge carrier,
   c. a back surface reflector for said active semiconductor layer, said back surface reflector having a solar spectrum reflectivity of at least about 70%; and,
   d. a substrate.

6. A solar cell of claim 5 wherein said semiconductor layer comprises a layer of silicon.

7. A solar cell of claim 6 wherein said junction comprises a Schottky barrier formed between said semiconductor layer and a metal having a thickness at which said metal is transparent to solar radiation.

8. A solar cell of claim 7 wherein said metal comprises silver, platinum, palladium or aluminum.

9. A solar cell of claim 8 additionally including an antireflection coating on said metal.

10. A solar cell of claim 6 wherein said junction comprises a p-n junction.

11. A solar cell of claim 6 wherein said junction comprises a p-i-n junction.

12. A solar cell of claim 6 wherein said substrate comprises glass.

13. A solar cell of claim 6 wherein said substrate comprises a polymeric film.

14. A solar cell of claim 4, 6, 7, 9 or 13 wherein said solar cell has a light-trapping structure.

15. A solar cell of claim 14 wherein said back surface reflector comprises silver.

* * * * *